(12) United States Patent
Macaulay et al.

(10) Patent No.: US 7,958,174 B2
(45) Date of Patent: Jun. 7, 2011

(54) RANDOM NUMBER GENERATORS AND SYSTEMS AND METHODS RELATING TO THE SAME

(75) Inventors: Rob Macaulay, Cambridge (GB); Morgan Colmer, Swavesey (GB)

(73) Assignee: GS IP Limited Liability Co., Wilmington, DE (US)

(*) Notice: Subject to any disclaimer, the term of this patent is extended or adjusted under 35 U.S.C. 154(b) by 932 days.

(21) Appl. No.: 11/851,697

(22) Filed: Sep. 7, 2007

(65) Prior Publication Data
US 2008/0104156 A1    May 1, 2008

(30) Foreign Application Priority Data
Sep. 11, 2006  (GB) .................................. 0617848.7

(51) Int. Cl.
*G06F 7/58* (2006.01)
(52) U.S. Cl. ...................................... 708/250
(58) Field of Classification Search .......................... None
See application file for complete search history.

(56) References Cited

U.S. PATENT DOCUMENTS

| | | | |
|---|---|---|---|
| 6,218,973 B1 | 4/2001 | Barrett et al. | |
| 6,337,643 B1* | 1/2002 | Gabet et al. | 341/131 |
| 6,839,010 B1 | 1/2005 | Tsyrganovich | |
| 2007/0050437 A1* | 3/2007 | Krayer Pitz et al. | 708/250 |
| 2007/0139241 A1* | 6/2007 | Hales et al. | 341/143 |

FOREIGN PATENT DOCUMENTS

| | | |
|---|---|---|
| JP | 2004-289793 | 10/2004 |
| JP | 2006-189946 | 7/2006 |

OTHER PUBLICATIONS

International Search Report and Written Opinion for the corresponding PCT/GB2007/003429, filed Nov. 9, 2007.
Decision to Grant Patent, Japan Patent Office, JP 2009-518972, mailed Oct. 29, 2010.

* cited by examiner

*Primary Examiner* — David H Malzahn

(57) ABSTRACT

A random number generator comprising a sigma-delta modulator, the sigma-delta modulator having a modulation unit and a feedback loop arranged to receive a digital output signal from the modulator and form an adjustment signal in dependence on the digital output signal such that at any given time the absolute difference between an amplitude of a summation output signal of the modulator and a quantizer threshold of the modulator is less than the first voltage range. The random number generator is thus capable of forming a digital output signal that has a high degree of entropy.

35 Claims, 8 Drawing Sheets

RANDOM NUMBER GENERATORS AND SYSTEMS AND METHODS RELATING TO THE SAME

CROSS-REFERENCE TO RELATED APPLICATION

This application claims priority to United Kingdom Patent Application No. 0617848.7, filed Sep. 11, 2006 (title: "Sigma-Delta Random Number Generator", by applicant Global Silicon Limited), which is incorporated herein by reference.

FIELD OF THE DISCLOSURE

This disclosure relates to a circuit for use as a random number generator.

BACKGROUND

Random number generators produce sequences of numbers in which a number cannot be predicted from the previous numbers in the sequence. Important qualities of a sequence of random numbers are that there is no repetition, a good numeric distribution and a lack of predictability. Random number generators are used in many different applications including security systems (e.g. for encryption purposes) and sampling applications (e.g. opinion polls) and in casinos.

Existing random number generators are implemented in either hardware or software. Hardware random number generators typically generate random numbers from a physical process such as radioactive decay of atoms detected by a Geiger counter or atmospheric noise detected by a radio receiver. These physical processes are, in theory, completely unpredictable and so a sequence of numbers generated by monitoring such a physical process should be random. However, it is not always convenient for a piece of equipment that requires random number generation to have to be placed near a physical process, such as radioactive decay, in order to monitor that process. Also, the monitoring equipment can tend to be bulky, which makes it unsuitable for space limited applications.

Most random number generators are not hardware devices, but are algorithms implemented by software routines. These are often called pseudo-random number generators as they cannot be truly random. This is because the algorithms that generate the random sequence typically use previously generated numbers to generate subsequent numbers in the sequence. Therefore, given the original state of the generator, and the specific algorithm, the sequence generated by such a random number generator is predictable. Even if only part of this information is known, it can render the random number generator insecure for security applications.

SUMMARY OF THE DISCLOSURE

According to a first aspect of this disclosure, there is disclosed a random number generator comprising a sigma-delta modulator, the sigma-delta modulator having a modulation unit comprising: a summation unit arranged to receive an analog input signal that varies due to noise over a first voltage range, the summation unit being arranged to sum the analog input signal with an adjustment signal to form a summation output signal; a loop filter arranged to receive the summation output signal and form a filtered output signal dependent thereon; and a quantizer arranged to receive the filtered output signal, compare the filtered output signal with a quantizer threshold and form a digital output signal by selecting between one of two predetermined voltage levels for the digital output signal in dependence on the comparison; and the sigma-delta modulator further comprising a feedback loop arranged to receive the digital output signal and form the adjustment signal in dependence on the digital output signal such that at any given time the absolute difference between an amplitude of the summation output signal and the quantizer threshold is less than the first voltage range, the random number generator thereby being capable of forming the digital output signal derived from the analog input signal and with the digital output signal having a high degree of entropy.

The feedback loop may comprise a selection circuit arranged to select between one of two boundary values for the adjustment signal in dependence on the digital output signal.

The modulation unit may be arranged such that if the boundary values are held constant then the digital output signal is representative of the level of the analog input signal in the range between the two boundary values.

The voltage range between the two boundary values may be less than a nominal input range associated with the sigma-delta modulator.

The voltage range between the two boundary values may be less than 0.1V.

The modulation unit and the feedback loop may be respectively arranged to iteratively generate the digital output signal and the adjustment signal, the selection circuit being arranged to select between one of the two boundary values at each iteration.

The selection circuit may be arranged to select between one of the two boundary values in dependence on the instantaneous value of the digital output signal.

The quantizer may be arranged to form the digital output signal by selecting between a first voltage level and a second voltage level for the digital output signal, the selection circuit being arranged to select a first one of the boundary values responsive to the digital output signal having the first voltage level and to select a second one of the boundary values responsive to the digital output signal having the second voltage level.

The random number generator may comprise a control unit, the control unit being arranged to monitor the variation due to noise of the analog input signal and to select between the two boundary values for the adjustment signal in dependence on that variation.

In one embodiment, the selection circuit comprises a multiplexer arranged to receive the digital output signal and to output one of the two boundary values in dependence on the digital output signal. The control unit may be comprised in the selection circuit, the control unit being arranged to generate first and second control signals in dependence on the analog input signal. The selection unit may also comprise a first digital-to-analog converter and a second digital-to-analog converter, each of the first and second digital-to-analog converters being arranged to receive a respective one of the first and second control signals and to output a respective boundary value in dependence on that control signal.

The control unit may generate the first and second control signals so as to cause effective amplification of the analog input signal by the sigma-delta modulator and so as to cause effective offset of the analog input signal by the sigma-delta modulator.

Each of the two boundary values may correspond to a respective voltage level and the control unit may be operable to cause effective amplification of the analog input signal by generating the first and second control signals such that the difference between the two respective voltage levels is decreased.

Each of the two boundary values may correspond to a respective voltage level and the control unit may be operable to cause effective offset of the analog input signal by generating the first and second control signals such that the sum of the two respective voltage levels is non-zero.

In one embodiment, the control unit is arranged to output a control signal to the selection circuit and the selection circuit comprises a logic circuit arranged to select one of the two boundary values for the adjustment signal in dependence on both the control signal and the digital output signal. The control unit may generate the control signal such that selected portions of the digital output signal are replaced with transition-cycles. The control unit may be operable to increase the effective gain of the sigma-delta modulator by replacing an increased proportion of the digital output signal with transition-cycles. The control unit may also be operable to cause effective offset of the analog input signal by generating the control signal so as to replace a greater or lesser proportion of the digital output signal having the one of the two predetermined values with transition-cycles.

The net average value of a transition-cycle may be equal to the virtual ground value for the modulator.

The virtual ground value of the modulator may be midway between the two boundary values.

The control unit may be arranged to determine the proportion of the digital output signal having one of the two predetermined voltage levels and, if that proportion is not substantially identical to 50%, to cause effective offset of the analog input signal.

According to a second aspect of this disclosure, there is disclosed a method of using a sigma-delta modulator to generate random numbers.

BRIEF DESCRIPTION OF THE DRAWINGS

For a better understanding of the present disclosure, reference is made by way of example to the following drawings, in which.

DETAILED DESCRIPTION

A random number generator of the instant disclosure may use a sigma-delta modulator to generate a digital output signal having a high degree of entropy. The digital output signal may be derived from an analog input signal that includes a noise component. The input range of the sigma-delta modulator may be set so that the digital conversion operation of the modulator is sensitive to the random amplitude fluctuations in the noise component of the analog input signal, thereby enabling a high degree of entropy to be obtained in the digital output signal.

A random number generator that uses a sigma-delta modulator to generate a digital output signal having a high degree of entropy may provide an implementation of a random number generator that may be cheap to manufacture. The random number generator also may be relatively small, which makes it particularly suitable for space-limited applications.

Sigma-delta modulators are digital-to-analog converters that convert analog input signals into a stream of ones and zeros. A sigma-delta modulator is typically clocked at a much higher frequency than the analog frequency of the analog input signal. The digital output signal is therefore of a higher frequency than the analog input signal. The ratio of ones to zeros contained in the digital signal output by the sigma-delta modulator is representative of the magnitude of the analog input signal compared with the input range of the sigma-delta modulator.

The operation of a sigma-delta modulator may be described using a 1-bit implementation. A 1-bit sigma-delta modulator is illustrated in FIG. 1.

Figure 1:
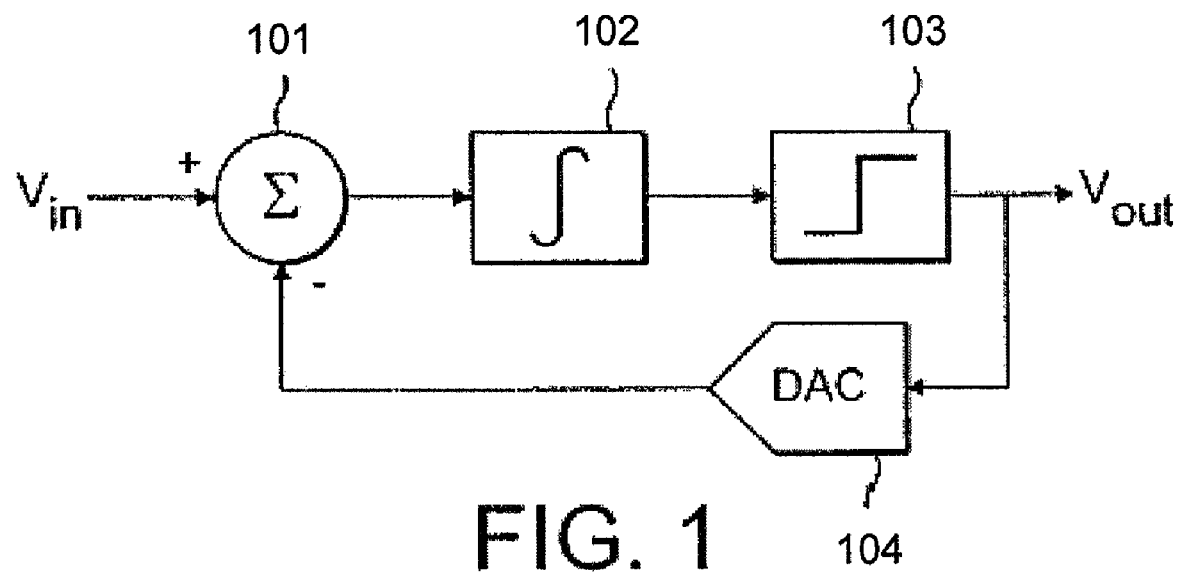
FIG. 1 shows a typical sigma-delta modulator.

In the basic implementation illustrated in FIG. 1, the sigma-delta modulator comprises a summation unit 101, an integrator 102, a comparator 103 and a digital-to-analog converter (DAC) 104. The summation unit may be, for example, a difference amplifier. The comparator may be an analog-to-digital converter (ADC).

As can be seen in FIG. 1, the components of the modulator are connected in a feedback loop. The analog input signal is fed into the summation unit, where a feedback signal is subtracted, before being fed into a loop filter, which in this case is an integrator. The signal output from the integrator is compared with a reference signal in the comparator. If the output signal from the integrator is greater than the reference signal, a 'one' is output, and if the integrator output signal is less than the reference signal, a 'zero' is output. Thus the analog input signal has been converted into a digital output signal.

The digital output signal is fed back, via the DAC, to the summation unit, where it is subtracted from the input signal. The purpose of the feedback signal is to maintain the average output of the integrator near the comparator's reference level by making the ones and zeros of the digital output signal representative of the analog input.

The DAC in the feedback loop has an upper reference voltage and a lower reference voltage. When the comparator outputs a 'one', the DAC outputs a signal at the upper voltage and when the comparator outputs a 'zero', the DAC outputs a signal at the lower voltage. The modulator is at full-range scale when the input signal is equal to the upper or lower reference voltages of the feedback DAC. For example, if the feedback DAC outputs −2.5V when it receives a zero and 2.5V when it receives a one then the range of the input is ±2.5V. The reference voltage of the comparator is halfway between the upper and lower boundaries of the input range, e.g. for an input range of ±2.5V the reference voltage for the comparator would be 0V. The reference voltage for the comparator represents the virtual ground level for the modulator. For modulators having an input range that is symmetrical about zero, the virtual ground level is zero.

The output from the sigma-delta modulator is a stream of ones and zeros. The ratio of ones to zeros represents the magnitude of the input signal compared with the input range of the modulator. For example, if the range of the modulator is ±2.5V and the input signal has a magnitude of 1.0V, then the input signal is 3.5V above the lower boundary of a 5V range. In this example, 70% of the output signal should consist of ones. For the modulator to produce a digital output signal that is an accurate representation of the analog input signal, the modulator should sample at a much greater rate than the rate of change of the analog input signal.

More sophisticated sigma-delta modulators than the 1-bit modulator described above may have multiple modulators and integrators.

The sigma-delta modulator offers enhanced resolution when the input signal varies between the upper and lower limits of the modulator's input range. The upper and lower limits can be considered as ±Vcc/2 about the virtual ground level of the modulator (i.e. the modulator has an input range of Vcc).

In the random number generator according to embodiments of the disclosure, a sigma-delta modulator is used to output a digital output signal having a high degree of entropy, i.e. a substantially random stream of ones and zeros. This is achieved by effectively digitizing a noise component of an analog input signal. The noise component of the analog input signal should therefore lie within the input range of the sigma-delta modulator. In addition, as the noise component of an analog input signal will typically vary over a relatively small voltage range, the input range of the analog input signal should be set so that the modulator is sufficiently sensitive over that relatively small voltage range. If the modulator is not sufficiently sensitive, the digital output signal will be representative of a non-random component of the analog input signal rather than the noise component.

The sensitivity of a sigma-delta modulator is determined by its input range, which is in turn determined by the feedback signal. For example, the input range of the sigma-delta modulator can be controlled by adjusting the voltage range over which the feedback signal varies or by inserting transition cycles into the digital output signal. This is described in more detail below with reference to specific implementations of a sigma-delta modulator.

In the specific implementations of a sigma-delta modulator described below, a control unit may be used to monitor the noise component of the analog input signal and form the feedback signal in dependence on that noise component. Specifically, the control unit may select between two boundary values for the feedback signal in dependence on the variation in the noise component of the analog input signal. The control unit will now be described in more detail with reference to two different implementations of a sigma-delta modulator.

For the sigma-delta modulator to function as a random number generator, the feedback signal should be generated in such a way that the signal received by the comparator fluctuates above and below the voltage level of the reference signal in a substantially random manner. In other words, the comparator should receive a signal in which the noise component is large enough that its random fluctuations routinely cross the comparator's reference threshold. In this way, the digital output signal should contain a substantially random stream of ones and zeros as the comparator determines that the signal output from the loop filter is respectively higher or lower than its reference level.

As stated above, the purpose of the feedback signal is to maintain the average output of the loop filter near the comparator's reference level by making the ones and zeros of the digital output signal representative of the analog input signal. It is typically not possible to maintain the average output of the integrator exactly at the comparator's reference level. Therefore, it is possible to write the following:

$$\frac{1}{T}\int_0^T (i(t) - f(t))dt \approx Q \tag{1}$$

where i(t) is the analog input signal, f(t) is the average magnitude of the feedback signal and Q is the comparator's reference level.

As it is not typically possible to maintain the difference between the analog input signal and the feedback signal exactly at the reference level of the comparator, there is an error factor that can be introduced into equation 1 to form the following:

$$\frac{1}{T}\int_0^T (i(t) - f(t))dt = Q + e \tag{2}$$

where e is an error factor.

The error factor represents the inherent offset that will be present between the average voltage level of the signal input into the comparator and the reference level of the comparator.

Figure 2A:
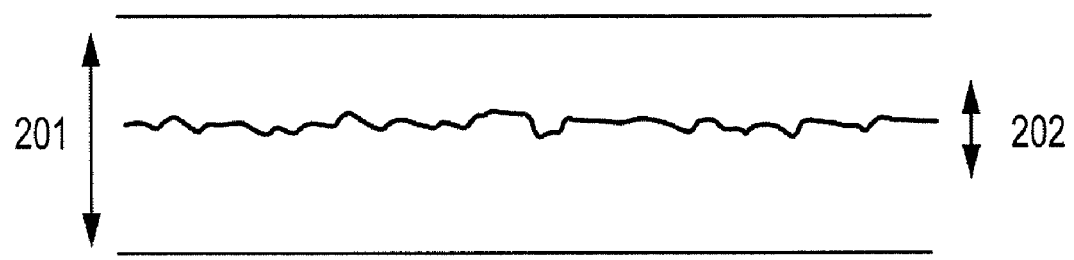
FIGS. 2a and 2b show an analog input signal containing a noise component and a signal output by a loop filter generated from that analog input signal.
Figure 2B:
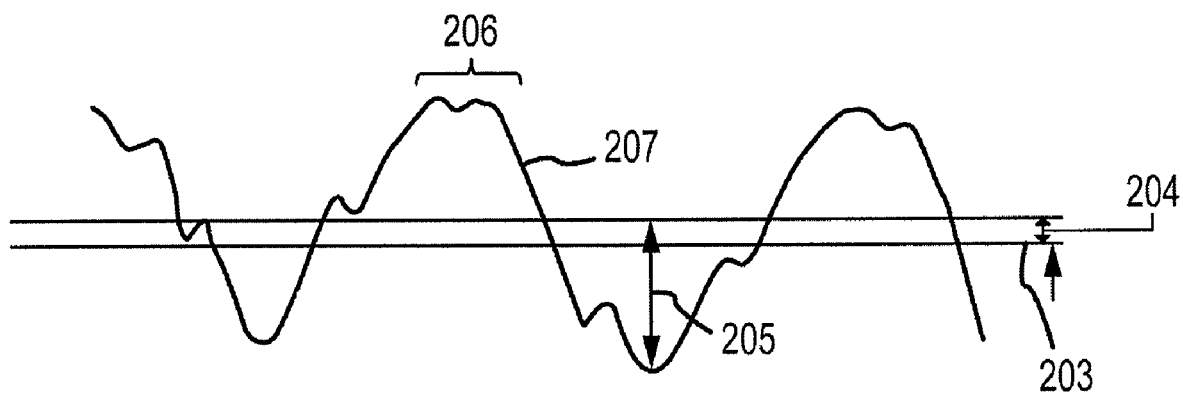

In addition, while the input signals to the comparator may have an average value that is approximately equal to the reference level of the comparator, at any given time the magnitude signal will tend to be either greater than or less than the reference level of the comparator. This is shown in FIGS. 2a and 2b. FIG. 2a illustrates an analog input signal having a d.c. component that is at the virtual ground level of the modulator (i.e. that is midway between the upper and lower limits of the allowable input range 201) and a noise component superimposed on the d.c. component that varies over a relatively small voltage range 202. The analog input signal results in the loop filter outputting a signal such as that shown in FIG. 2b.

The signal shown in FIG. 2b contains a sinusoidal component 207 that is representative of the d.c. component of the analog input signal and a randomly fluctuating component 206 that is representative of the noise component of the analog input signal. As the d.c. component of the analog input signal is positioned in the middle of the allowable input range, the digital output signal output by the sigma-delta modulator will contain 50% ones and 50% zeros. It can be seen from FIG. 2b that the signal is above the threshold level 203 of the comparator approximately 50% of the time and below the threshold level 203 of the comparator approximately 50% of the time. The ratio is not exactly 50:50 because of the error factor e, which causes a slight offset 204 between the signal and the reference level of the comparator.

It can be seen from FIG. 2b that the randomly fluctuating component 206 has a relatively small amplitude compared with that of the sinusoidal component. The majority of the crossings of the comparator reference level by the signal therefore result from the d.c. component of the analog input signal and not the noise component. This is because the modulator is not sufficiently sensitive, i.e., the input range of the modulator is too large. By moving the upper and lower limits of the input range 201 of the modulator in towards the noise component of the analog input signal, i.e., so that the noise component lies within the input range and extends across a greater proportion of its extent, the relative amplitude of the randomly fluctuating component in the signal input into the comparator will increase. In this way, the majority of crossings of the comparator's reference threshold will be due to the randomly fluctuating component, rather than the non-random component, which ensures a digital output signal having a high degree of entropy.

It can be seen from FIG. 2b that if the random fluctuations caused by noise in the analog input signal are to routinely cross the comparator's reference threshold, the amplitude 205 of the signal input into the comparator should be less than the amplitude of the randomly fluctuating signal. Therefore, neglecting the error factor (which can be assumed to be small), it can be seen that at any given time the difference between the comparator's reference level and the signal formed by subtracting the feedback signal from the analog input signal should be less than the voltage range over which the noise component of the analog input signal varies in order to ensure a high degree of entropy in the digital output signal. This can be written as follows:

$$|(i(t)-f(t))-Q|<N \qquad (3)$$

where N is the voltage range over which the noise component of the analog input signal varies.

Therefore, in order for the sigma-delta modulator to produce a digital output signal displaying a sufficiently high degree of entropy, the feedback signal may be formed so that equation 3 is satisfied at any given time.

In practice, a high degree of entropy can be achieved by setting the input range of the sigma-delta modulator to be relatively small. Such a setting might typically exceed the operating tolerances of the device that are set by the manufacturer. This can be achieved by setting the voltage range between the two boundary values (i.e. the upper and lower voltages between which the feedback signal varies) to be less than a nominal input range associated with the sigma-delta modulator. The nominal input range might be an operating tolerance set by the manufacturer. A suitable input range might be, for example, 0.1V or below.

The input range of a sigma-delta modulator can be permanently set, e.g. by the manufacturer setting boundary values for the feedback signal. The input range may alternatively be set by the user or by a control unit that monitors the analog input signal and controls the formation of the feedback signal so that the input range is appropriate to the analog input signal. The input range can be changed by altering both the absolute values of its upper and lower limits and by changing its voltage range. Changing these values can be considered as applying effective gain or offset to the analog input signal. The exact input range that should be used to generate a digital output signal having a high degree of entropy depends on the particular analog input signal.

The analog input signal may include a d.c. component at a substantially steady voltage level, e.g., 1V, with a noise component superimposed on that steady voltage level. In one embodiment, the analog input signal consists of a d.c. component at a substantially steady voltage level with a noise component superimposed on that steady voltage level. Alternatively, the noise component could be superimposed on a non-random signal of varying amplitude, such as an a.c. signal.

The input signal may comprise a noise component superimposed on a d.c. component rather than a component of varying amplitude because otherwise the input range of the sigma-delta modulator has to be continually adjusted to account for non-random fluctuations in the analog input signal. Such continual adjustment can be achieved by monitoring the analog input signal and implementing effective offset of the analog input signal as its average amplitude changes due to the non-random component. However, it is simpler to use a d.c. component, which obviates the need for such continual adjustment in the short term. In the long term, slight adjustments of the input range may be needed due to unavoidable fluctuations in the d.c. voltage level (e.g., caused by long-term temperature changes).

Different implementations of sigma-delta modulators that are suitable for being used as random number generators will now be described. These specific implementations are given for the purposes of example only and do not limit the instant to disclosure to any specific implementation of a sigma-delta modulator.

One option for changing the input range of a sigma-delta modulator is to introduce transition-cycles into the feedback path. Transition-cycles have a net average value equal to the virtual ground level of the modulator. By introducing more transition-cycles into the feedback path the overall average level of the feedback is reduced, which has the effect of applying a effective amplification to the analog input signal.

Figure 3:
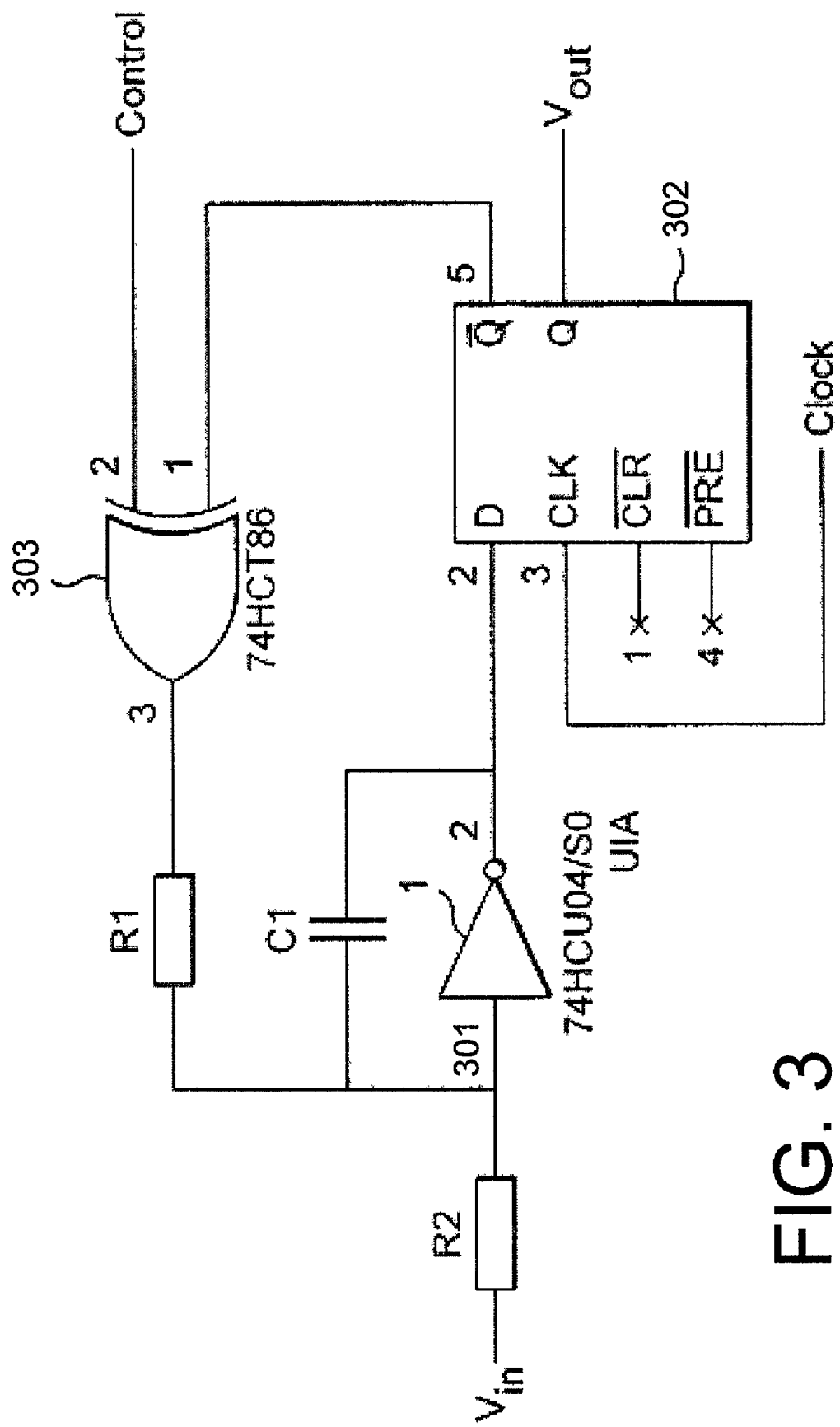
FIG. 3 illustrates a sigma-delta modulator capable of causing effective gain and offset of an analog input signal by means of a logic circuit in the feedback loop.

FIG. 3 illustrates a sigma-delta modulator that introduces transition-cycles into the feedback path. The loop filter 301 is an integrator circuit, the quantizer is a latch 302 and the feedback DAC has been replaced by an exclusive-OR gate (an XOR gate) 303. The XOR gate has as its inputs the digital feedback signal and a control signal.

Figure 4:
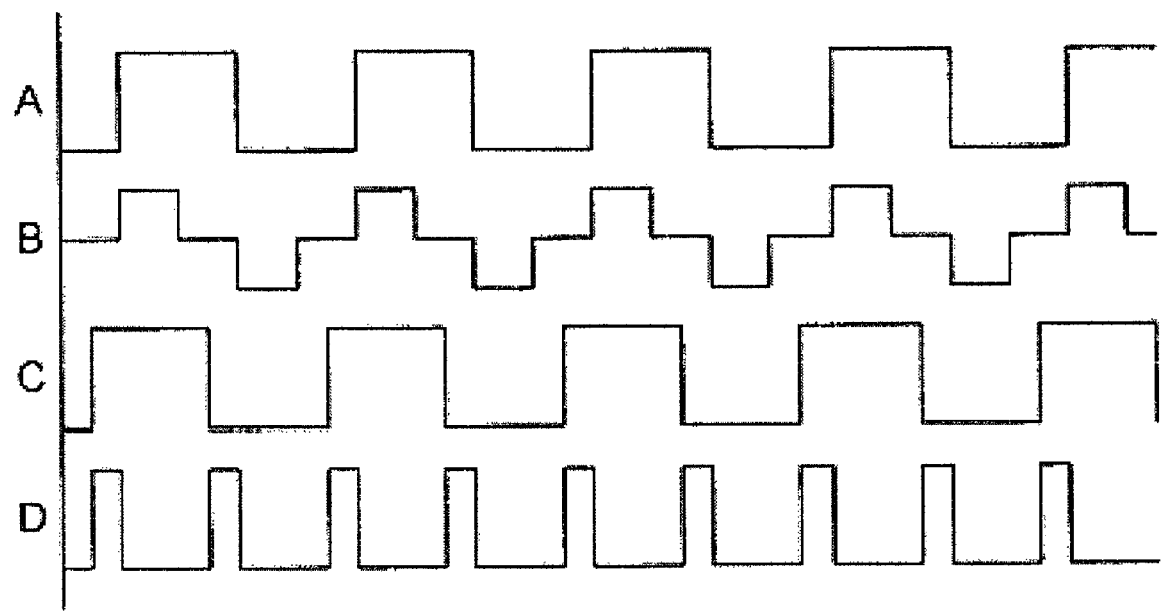
FIGS. 4a to d show waveforms for implementing a gain function in a sigma-delta modulator.

Waveform A of FIG. 4 shows a typical feedback signal for an input that is at the virtual ground level. In FIG. 4, the virtual ground level has been set at ½ Vcc. The signal has a 50% duty cycle, i.e. half the cycles take the upper limit of Vcc and half the lower limit of 0V. The signal therefore represents an input having a magnitude that is midway between the upper and lower limits of the input range of the modulator, which is ½ Vcc in this case.

Waveform B of FIG. 4 illustrates an equivalent feedback signal including transition-cycles. Waveform A, which is a non-return-to-zero (NRZ) waveform, has been converted to a return-to-zero (RTZ) waveform. As can be seen from the figure, the transition-cycles have a net average value of ½ Vcc (virtual ground).

Waveform B illustrated in FIG. 4 is difficult to directly synthesize. However, since the requirement for the transition-cycles is only that their net average value is equal to the virtual ground level, waveform C in FIG. 4 will have the same effect on the overall feedback level seen by the integrator as waveform B. In waveform C the transition-cycles have, in effect, been implemented as a pair of pulses, having an average value of ½ Vcc.

Waveform C can be easily generated from waveform A by using an XOR gate with waveform D (also illustrated in FIG. 4). Therefore, in the sigma-delta modulator shown in FIG. 3, the digital output signal (waveform A) and the control signal (waveform D) are input into an XOR gate to create the feedback signal (waveform C). Note that the feedback signal still has a 50% duty cycle so the modulator is still balanced with an input of ½ Vcc. In other words, for an input signal at virtual ground, the situation is unchanged by the introduction of transition-cycles into the feedback signal.

Figure 5:
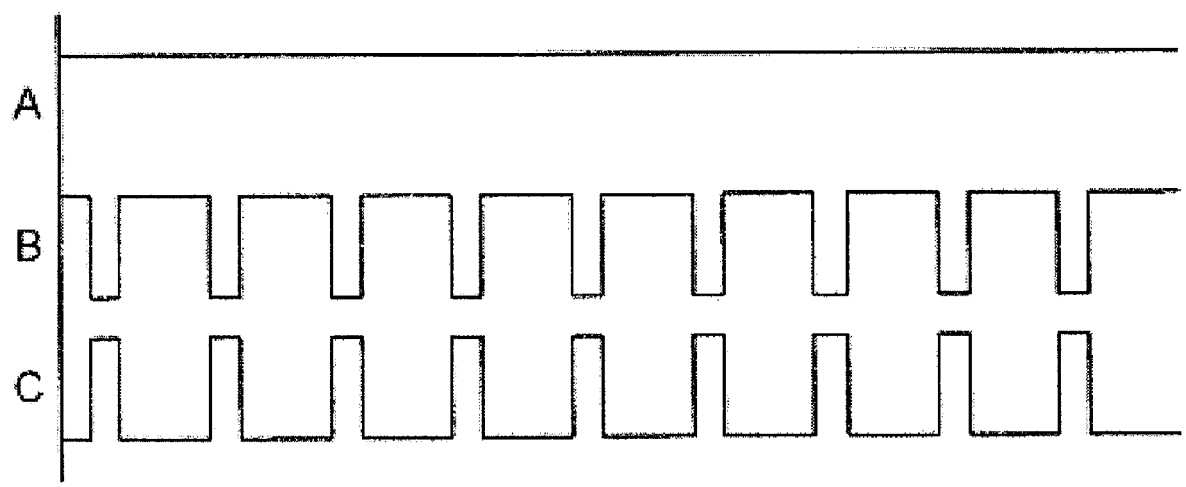
FIGS. 5a to c show waveforms for implementing a gain function in a sigma-delta modulator.

Waveforms A, B and C of FIG. 5 are similar waveforms for the situation where the modulator has a full scale positive input (Vcc). The digital output signal of the modulator is waveform A. As the input is at the upper limit, the output signal is always high (100% ones). If the same control signal (waveform C) were applied to the XOR gate along with the digital output signal, then the feedback waveform B is generated. This time, the feedback signal has a net DC content of ¾ Vcc. Therefore, an input of ¾ Vcc would be balanced by this feedback signal and the upper input limit to the modulator has been reduced by ¼ Vcc.

Similarly, if the input to the modulator has a full scale negative input (0V), the same control signal would produce a feedback signal having a net DC content of ¼ Vcc. Therefore, an input of ¼ Vcc would be balanced by this feedback signal and the upper input limit to the modulator has been increased by ¼ Vcc.

Therefore, overall, the waveform D of FIG. 4 and waveform C of FIG. 5 have managed to decrease the input range of the modulator from Vcc to ½ Vcc. The modulator has an implied gain of two. By reducing the input range into the modulator by half, the control signal has effectively achieved the same result as an amplification by a factor of two prior to the sigma-delta modulator.

The control and feedback signals may have a higher frequency than the digital output signal. To achieve this, the XOR gate and the quantizer can receive different clock signals.

The control signal can also be used to apply an offset. This can be achieved using the same basic circuit as illustrated in FIG. 3. In this application, the control signal is arranged such that transition-cycles are injected into the feedback signal in an asymmetric manner. Replacing more 'ones' than 'zeros' in the output signal, causes the generated feedback signal to apply a positive offset to the input signal. This is because the net DC content of the feedback signal is decreased relative to the situation where the same number of transition-cycles is inserted into the feedback signal, but in a symmetric manner. Similarly, by replacing more 'zeros' than 'ones', a negative offset can be applied.

The control signal can be of a predetermined form that is arranged for a particular input. For example, in CD players, an appropriate, predetermined control signal may be selected according to the type of CD being played.

The control signal may be generated by a control unit.

The control unit can have analog, digital or software implementations.

The control signal may be adaptive. For example, the control signal could be altered during operation to account for variation in a d.c. component of the analog input signal.

The system may, using the principles set out above, apply both effective gain and effective offset to the input signal.

According to one embodiment, the control unit may be arranged to monitor the conditions related to the input signal. For example, in the random number generator, the control unit may be arranged to monitor the noise component of the analog input signal.

An effective gain or offset could be applied to the analog input signal in the analog domain, rather than the digital implementation described above. For example, the analog input signal could be amplified prior to the sigma-delta modulator. However, analog methods of implementing variable gain and offset can be complicated. By implementing the gain and offset in the digital domain variable gain and offset control can be implemented simply and effectively in the sigma-delta modulator. In effect, in the embodiment described above, the XOR gate can be seen as a programmable amplifier.

The XOR gate may be under the control of a special logic unit within a chip.

Figure 6:
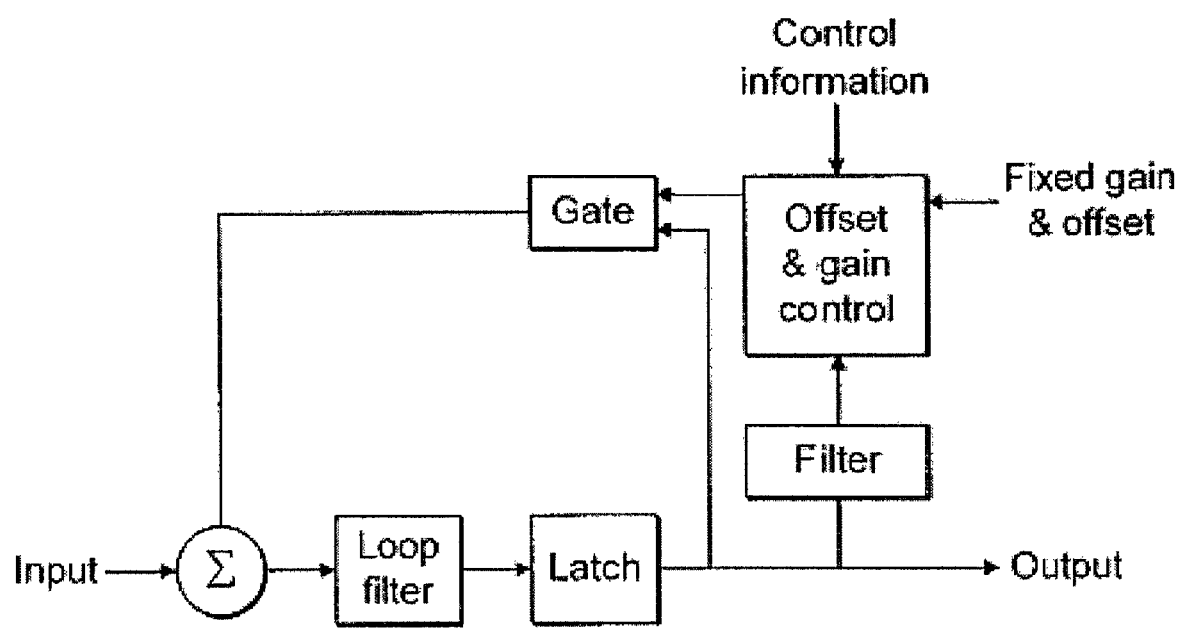
FIG. 6 shows a general implementation of a sigma-delta modulator capable of applying effective gain and offset to an analog input signal.

FIG. 6 illustrates a general embodiment of a sigma-delta modulator according to the above considerations.

Figure 7:
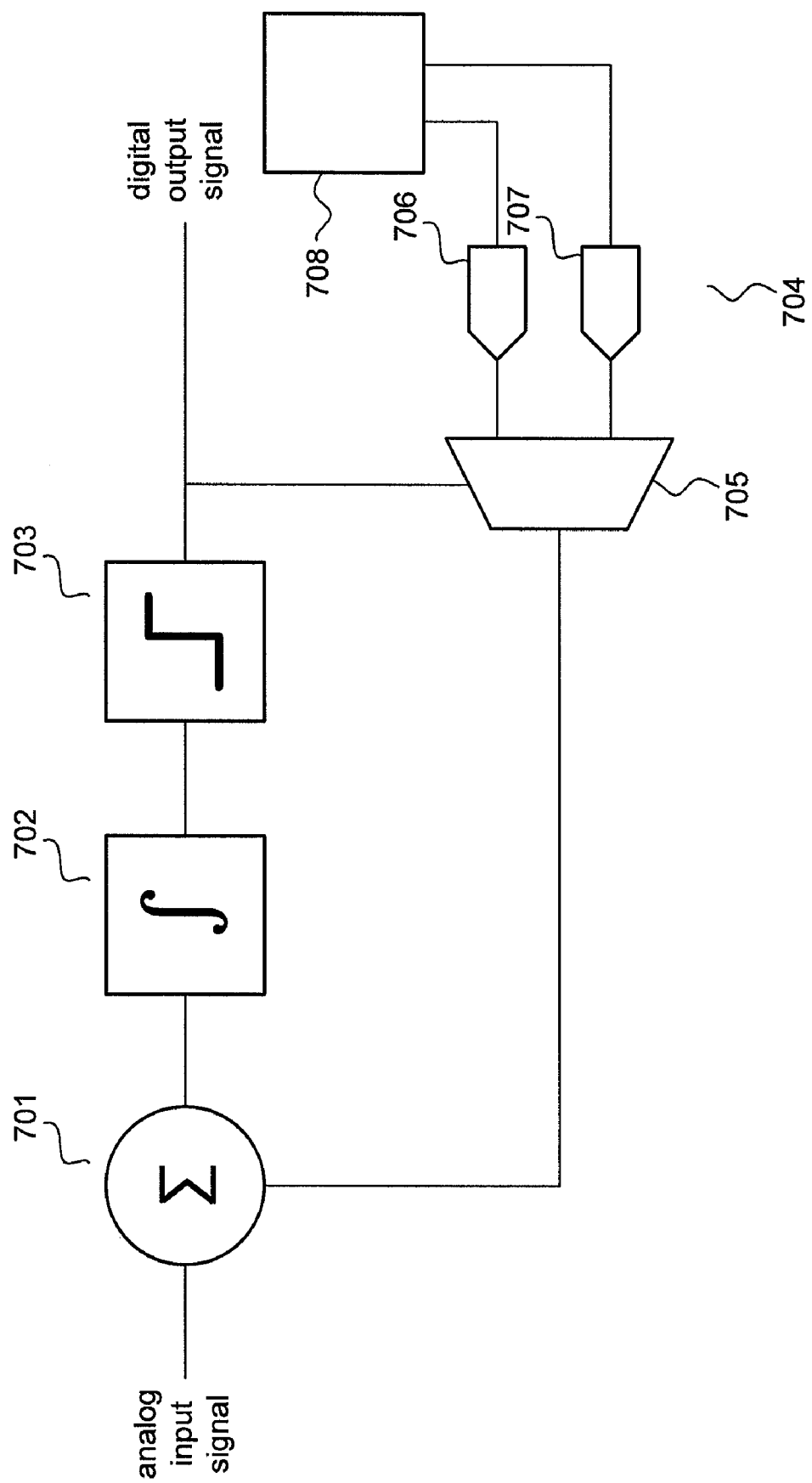
FIG. 7 shows a software-controlled sigma-delta modulator.

An alternative sigma-delta modulator is illustrated in FIG. 7.

The allowable input range of a sigma-delta modulator is determined by the upper and lower voltages of the feedback signal. In the sigma-delta modulator shown in FIG. 7, the upper and lower voltages of the feedback signal are set by two boundary voltages. The feedback signal is formed by using the digital output signal to select between the two boundary voltages. The effective gain and offset of the sigma-delta modulator is controlled by selecting appropriate values for the boundary voltages.

A sigma-delta modulator in which effective gain and offset are controlled by setting boundary voltages is illustrated in FIG. 7. The modulator comprises a summation unit 701, an integrator 702, a quantizer 703 and a selection circuit 704 connected in a feedback loop.

The summation unit is arranged to receive an analog input signal and an adjustment signal, which is output by the selection circuit. The summation unit subtracts the adjustment signal from the analog input signal and outputs the subtracted signal to the integrator. The integrator filters the subtracted signal and outputs the filtered signal to the quantizer, which compares the integrated signal to a reference signal in the comparator. If the output signal from the integrator is greater than the reference signal, a 'one' is output, and if the integrator output signal is less than the reference signal, a 'zero' is output. Thus, the analog input signal has been converted into a digital output signal.

The modulator outputs the digital output signal. The digital output signal is also fed back to the selection circuit. The role of the selection circuit is to set the input range of the sigma-delta modulator via the adjustment signal.

The selection circuit according to the embodiment of the disclosure shown in FIG. 7 comprises a multiplexer 705, a first DAC 706, a second DAC 707 and a control unit 708. The multiplexer receives as inputs the digital output signal and two boundary values. Each boundary value is a voltage output from a respective one of the two DACs. The first DAC outputs a first boundary value and the second DAC outputs a second boundary value. The voltage output by each DAC is controlled by a control signal generated by the control unit. The control unit is therefore able to control the boundary values input into the multiplexer via the two control signals.

The control unit may be implemented in software, which may suitably be executed by a digital processor. The control signals generated by the control unit may suitably be digital signals.

The digital output signal controls which of the two boundary values is output by the multiplexer at any given time. When the digital output signal is high, i.e. when the sigma-delta modulator is outputting a 'one', the multiplexer outputs one of the two boundary values. When the digital output signal is low, i.e. when the sigma-delta modulator is outputting a 'zero', the multiplexer outputs the other of the two boundary values. The adjustment signal output by the multiplexer therefore contains the same sequence of ones and zeros as the digital output signal, but with the voltage level of each 'one' and 'zero' in the digital output signal replaced by a respective one of the two boundary values. The upper and lower limits between which the adjustment signal varies can therefore be controlled by adjusting the two boundary values. In this way, the gain and offset applied to the analog input signal by the sigma-delta modulator can be directly controlled by the control unit.

The control unit may be arranged to monitor the analog input signal and adjust the feedback signal accordingly so that the resolution of the sigma-delta modulator is sufficiently sensitive that the noise component of the analog input signal is effectively digitized to form the digital output signal. The control unit may, for example, implement a monitoring process based on equation 3 above.

Figure 8:
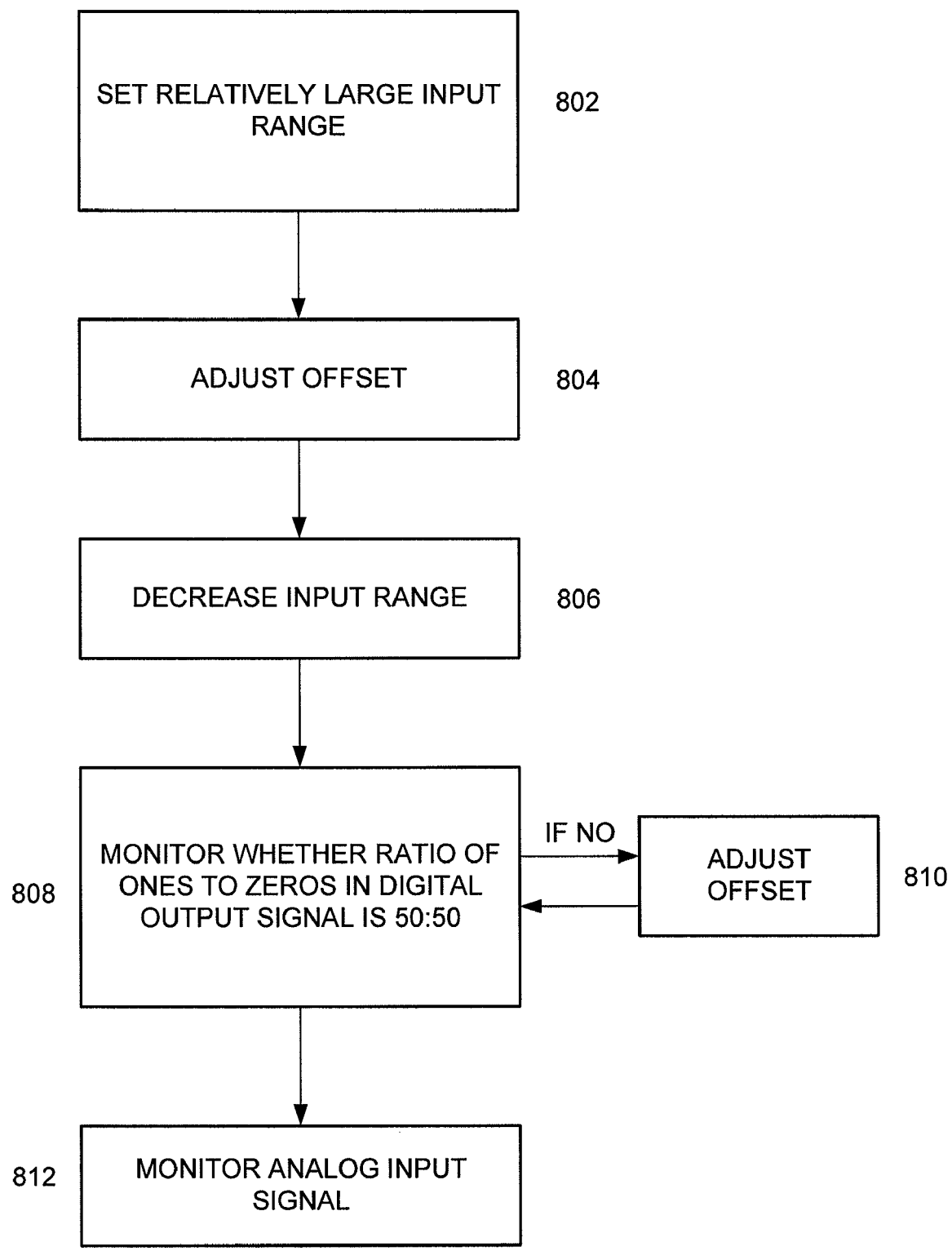
FIG. 8 shows a flow diagram of an algorithm suitable for use by a random number generator.

One algorithm that may be implemented by the control unit is illustrated in FIG. 8. In step 802 the control unit initially sets the input range of the modulator to be relatively large. The control unit then monitors the analog input signal and adjusts the effective offset of the modulator in step 804 so that the noise component lies within the input range of the modulator, and in some embodiments at the midway point of the input range. The control unit then decreases the input range of the modulator in step 806 until the noise component spans the full input range (thus obtaining maximum sensitivity to the noise fluctuations). This should generate a digital output signal having a high degree of entropy. The control unit then monitors the digital output signal in step 808. The ratio of ones to zeros in the digital output signal may be about 50:50. If this is not the case, then the control unit may adjust the input range of the modulator accordingly in step 810. For example, it may be necessary to adjust the effective offset of the modulator. In step 812, the control unit continues to monitor the analog input signal and to adjust the input range of the modulator when required.

It should be understood that the first-order sigma-delta modulators as described above are only examples, and that the principle of the disclosure remains the same for other modulators. Any kind of sigma-delta modulator could be used, for example, analog, digital or switched capacitor. The loop filter has been shown specifically as an integrator. However, any loop filter that provides a modulator having a low pass frequency response with respect to the input signal could be used. Although the quantizer has been shown as a two-level type, it could have any number of levels. The method according to the present disclosure is applicable to any order of modulator.

A random number generator according to the disclosure may be used in a wide range of applications, such as generating public and private keys for security applications (e.g. in a wireless set-up device or other devices that use encryption) or for generating random numbers in sampling applications (e.g. for use in casino systems or opinion polls).

The noise component of the analog input signal may be provided from an intrinsic source, such as e.g. thermal noise, shot noise, or 1/f noise. Alternatively, the noise component may be provided from an extrinsic source, such as e.g. RF interference or ground currents. The noise source may be advantageously linked to the specific implementation in which the random number generator is being utilized. For example, if the random number generator is used in an audio system having a radio receiver, it may be convenient to generate a signal that suffers from RF interference as the analog input signal. Means could be provided to deliberately add the noise to the input signal. Alternatively, the presence of noise in the signal may arise due to inherent features of the design.

The applicant hereby discloses in isolation each individual feature described herein and any combination of two or more such features, to the extent that such features or combinations are capable of being carried out based on the present specification as a whole in light of the common general knowledge of a person skilled in the art, irrespective of whether such features or combinations of features solve any problems disclosed herein, and without limitation to the scope of the claims. The applicant indicates that various embodiments may consist of any such feature or combination of features. In view of the foregoing description it will be evident to a person skilled in the art that various modifications may be made to the scope of the disclosure above.

What is claimed is:

1. An apparatus, comprising:
    a modulation unit comprising:
        a summation unit configured to:
            receive an analog input signal that varies due to noise over a first voltage range, and
            sum the analog input signal with an adjustment signal to form a summation output signal,
        a loop filter configured to form a filtered output signal using the summation output signal, and
        a quantizer configured to compare the filtered output signal with a quantizer threshold to generate a comparison, and form a digital output signal by selecting between one of two voltage levels for the digital output signal based on the comparison; and
    a feedback loop configured to form the adjustment signal based on the digital output signal such that an absolute difference between an amplitude of the summation output signal and the quantizer threshold is less than the first voltage range.

2. The apparatus of claim 1, wherein the feedback loop comprises a selection circuit configured to select between one of two boundary values for the adjustment signal based on the digital output signal.

3. The apparatus of claim 2, wherein the digital output signal represents a level of the analog input signal in a voltage range between the two boundary values, in response to the two boundary values being held constant.

4. The apparatus of claim 2, wherein a voltage range between the two boundary values is less than a nominal input range.

5. The apparatus of claim 2, wherein a voltage range between the two boundary values is less than 0.1 V.

6. The apparatus of claim 2, wherein the modulation unit and the feedback loop are configured to iteratively generate the digital output signal and the adjustment signal, and wherein the selection circuit is configured to select between one of the two boundary values per iteration.

7. The apparatus of claim 6, wherein the selection circuit is arranged to select between one of the two boundary values based on an instantaneous value of the digital output signal.

8. The apparatus of claim 7, wherein the quantizer is configured to form the digital output signal by selecting between a first voltage level and a second voltage level for the digital output signal, and wherein the selection circuit is configured to select a first one of the two boundary values responsive to the digital output signal having the first voltage level and to select a second one of the two boundary values responsive to the digital output signal having the second voltage level.

9. The apparatus of claim 2, further comprising a control unit configured to monitor a noise variation of the analog input signal and to select between the two boundary values for the adjustment signal based on the noise variation.

10. The apparatus of claim 9, wherein the control unit is configured to determine a proportion of the digital output signal having one of the two voltage levels and to effectively offset the analog input signal in response to determining the proportion is not substantially identical to 50%.

11. The apparatus of claim 9, wherein the control unit is configured to output a control signal to the selection circuit and wherein the selection circuit further comprises a logic circuit configured to select one of the two boundary values for the adjustment signal based on the control signal and the digital output signal.

12. The apparatus of claim 11, wherein the control unit is configured to insert transition-cycles in selected portions of the adjustment signal.

13. The apparatus of claim 12, wherein the control unit is configured to increase an effective gain by increasing a number of the selected portions of the adjustment signal that include the transition-cycles.

14. The apparatus of claim 13, wherein the control unit is configured to provide an offset to the analog input signal by inserting the transition-cycles into a proportion of the digital output signal having the one of the two boundary values.

15. The apparatus of claim 2, wherein the selection circuit comprises a multiplexer configured to output one of the two boundary values based on the digital output signal.

16. The apparatus of claim 2, wherein the selection circuit comprises a control unit configured to generate first and second control signals based on the analog input signal.

17. The apparatus of claim 16, wherein the selection circuit further comprises first and second digital-to-analog converters, wherein the first and second digital-to-analog converters are configured to receive a respective one of the first and second control signals and to output a respective boundary value based on the received control signal.

18. The apparatus of claim 16, wherein the control unit of the selection circuit is configured to generate the first and second control signals for effective amplification of the analog input signal.

19. The apparatus of claim 16, wherein the control unit of the selection circuit is configured to generate the first and second control signals for effective offset of the analog input signal.

20. The apparatus of claim 16, wherein each of the two boundary values corresponds to a respective voltage level, and wherein the control unit of the selection circuit is configured to generate the first and second control signals such that a difference between the two respective voltage levels is decreased.

21. The apparatus of claim 16, wherein each of the two boundary values corresponds to a respective voltage level, and wherein the control unit of the selection circuit is configured to generate the first and second control signals such that the sum of the two respective voltage levels is non-zero.

22. A random number generator comprising:
means for receiving an analog input signal that varies due to noise over a first voltage range;
means for forming a summation output signal by summing the analog input signal with an adjustment signal;
means for forming a filtered output signal using the summation output signal;
means for generating a comparison by comparing the filtered output signal with a quantizer threshold;
means for forming a digital output signal by selecting between one of two voltage levels for the digital output signal based on the comparison; and
means for forming the adjustment signal based on the digital output signal such that an absolute difference between an amplitude of the summation output signal and the quantizer threshold is less than the first voltage range.

23. The random number generator of claim 22, further comprising means for selecting between one of two boundary values for the adjustment signal based on the digital output signal.

24. The random number generator of claim 23, wherein the digital output signal represents a level of the analog input signal in a voltage range between the two boundary values, in response to the two boundary values being held constant.

25. The random number generator of claim 23, wherein a voltage range between the two boundary values is less than a nominal input range.

26. The random number generator of claim 23, wherein a voltage range between the two boundary values is less than 0.1 V.

27. The random number generator of claim 22, further comprising:
means for iteratively generating the digital output signal and the adjustment signal, and
means for selecting between one of two boundary values per iteration.

28. The random number generator of claim 27, further comprising means for selecting between one of the two boundary values based on an instantaneous value of the digital output signal.

29. The random number generator of claim 28, further comprising:
means for forming the digital output signal by selecting between a first voltage level and a second voltage level for the digital output signal;
means for selecting a first one of the two boundary values responsive to the digital output signal having the first voltage level; and
means for selecting a second one of the two boundary values responsive to the digital output signal having the second voltage level.

30. A method, comprising:
receiving, at a random number generator, an analog input signal that varies over a first voltage range;
forming, at the random number generator, a summation output signal by summing the analog input signal with an adjustment signal such that an absolute difference between an amplitude of the summation output signal and a quantizer threshold is less than the first voltage range;
forming, at the random number generator, a filtered output signal using the summation output signal;
generating, at the random number generator, a comparison by comparing the filtered output signal with the quantizer threshold; and
generating, at the random number generator, a digital output signal by selecting between one of two voltage levels for the digital output signal based on the comparison.

31. The method of claim 30, further comprising:
selecting one of two boundary values for the adjustment signal based on the digital output signal.

32. The method of claim 31, wherein selecting between one of the two boundary values comprises selecting one of the two boundary values based on an instantaneous value of the digital output signal.

33. The method of claim 31, wherein a voltage range between the two boundary values is less than a nominal input range.

34. The method of claim 30, further comprising:
iteratively generating the digital output signal and the adjustment signal; and
selecting between one of two boundary values per iteration.

35. The method of claim 34, wherein generating the digital output signal comprises:
selecting between a first voltage level and a second voltage level for the digital output signal;
selecting a first one of the two boundary values responsive to the digital output signal having the first voltage level; and
selecting a second one of the two boundary values responsive to the digital output signal having the second voltage level.

* * * * *